United States Patent
Orita et al.

[11] Patent Number: 6,117,700
[45] Date of Patent: Sep. 12, 2000

[54] METHOD FOR FABRICATING SEMICONDUCTOR DEVICE HAVING GROUP III NITRIDE

[75] Inventors: Kenji Orita; Masahiro Ishida; Shinji Nakamura; Masaaki Yuri, all of Osaka, Japan

[73] Assignee: Matsushita Electronics Corporation, Osaka, Japan

[21] Appl. No.: 09/389,024

[22] Filed: Sep. 2, 1999

[30] Foreign Application Priority Data

Sep. 9, 1998 [JP] Japan ................................ 10-254996
Nov. 17, 1998 [JP] Japan ................................ 10-326352

[51] Int. Cl.[7] .................................................. H01L 21/00
[52] U.S. Cl. ........................ 438/46; 438/22; 438/513; 438/688; 438/796
[58] Field of Search ......................... 438/22, 46, 513, 438/688, 796

[56] References Cited

U.S. PATENT DOCUMENTS 5,874,320  2/1999  Shih et al. .

FOREIGN PATENT DOCUMENTS

| 58-100471 | 6/1983 | Japan . |
|---|---|---|
| 6-9258 | 2/1994 | Japan . |
| 6-275868 | 9/1994 | Japan . |
| 6-350137 | 12/1994 | Japan . |
| 8-213656 | 8/1996 | Japan . |
| 10-144960 | 5/1998 | Japan . |
| 10-163529 | 6/1998 | Japan . |

*Primary Examiner*—Long Pham
*Attorney, Agent, or Firm*—Eric J. Robinson; Nixon Peabody LLP

[57] ABSTRACT

First, n-type contact layer of GaN, n-type cladding layer of AlGaN, active layer of InGaN, first Mg-doped layer of AlGaN and second Mg-doped layer of GaN are grown in this order over a sapphire substrate. Thereafter, the substrate, including the second Mg-doped layer, is exposed to nitrogen plasma for about 40 minutes. As a result, Mg, which has been introduced into the first and second Mg-doped layers, is activated as an acceptor. Thus, p-type cladding layer and p-type contact layer with low resistance and excellent crystallinity can be formed out of the first and second Mg-doped layers, respectively.

15 Claims, 9 Drawing Sheets

METHOD FOR FABRICATING SEMICONDUCTOR DEVICE HAVING GROUP III NITRIDE

BACKGROUND OF THE INVENTION

The present invention relates to a method for fabricating a semiconductor device of Group III nitride semiconductors.

A Group III nitride semiconductor, which is expressed by the general formula of $Al_xGa_{1-x-y}In_yN$ (where $0 \leq x \leq 1$, $0 \leq y \leq 1$ and $x+y \leq 1$) has a direct-transition-type band structure with a band gap energy ranging from about 1.9 eV to about 6.2 eV and excels in thermal resistance. Therefore, semiconductor devices made of these Group III nitride semiconductors are currently under vigorous research and development. A semiconductor light-emitting device made of compound semiconductors mainly containing gallium nitride, for example, attracts increasing attention as a strong candidate for a light source of a next-generation high-density optical disk or a full-color LED display.

To improve the operating performance of such a light-emitting device made of Group III nitride semiconductors, it is extremely important how to form a p-type semiconductor layer with a low resistance.

Hereinafter, a conventional method for forming a p-type semiconductor layer and a semiconductor device using such a layer will be exemplified with reference to FIG. 10.

Figure 10:
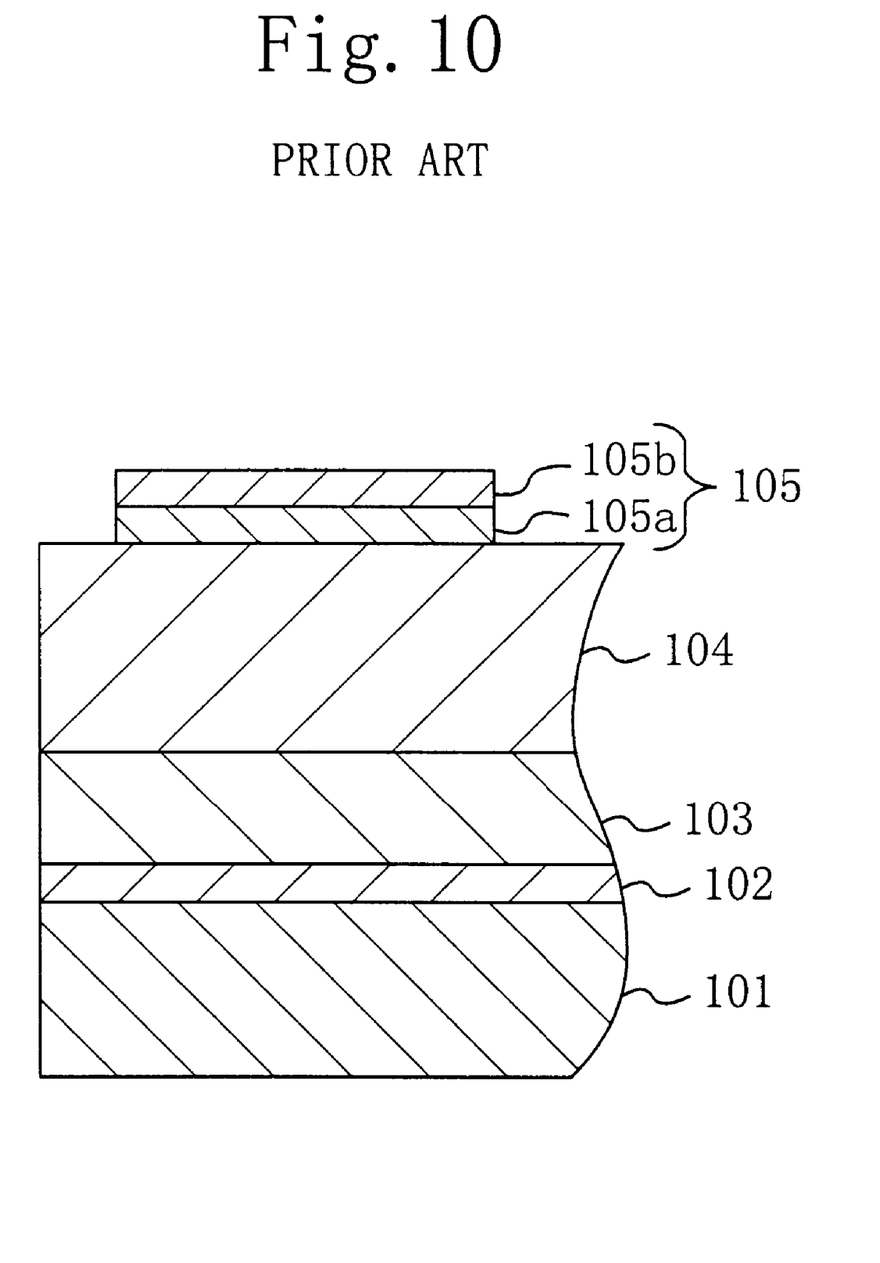
FIG. 10 is a cross-sectional view illustrating part of a conventional semiconductor device.

FIG. 10 illustrates a partial cross section of a conventional semiconductor device. As shown in FIG. 10, a buffer layer 102 of aluminum nitride (AlN) or gallium nitride (GaN) is formed on a sapphire substrate 101. A first semiconductor layer 103 of undoped GaN is formed on the buffer layer 102. A second semiconductor layer 104 of p-type GaN doped with magnesium (Mg) as an acceptor is formed on the first semiconductor layer 103. A p-side electrode 105 is formed on the second semiconductor layer 104 by alternately stacking nickel (Ni) and gold (Au) layers 105a and 105b one upon the other. In this example, only the method for forming the second semiconductor layer 104 will be specifically described and the illustration of an n-side electrode is omitted in FIG. 10.

Examples of the p-type dopant include magnesium (Mg), zinc (Zn), calcium (Ca), strontium (Sr) and beryllium (Be). Among these elements, Mg and Zn are used particularly often.

Generally speaking, even if the second semiconductor layer 104 is doped with a p-type dopant, the p-type dopant can hardly act as an acceptor as it is (i.e., without any special treatment). Thus, the second semiconductor layer 104 is composed of intrinsic (i-type) crystals with a resistivity as high as $1 \times 10^8$ $\Omega$cm or more. It is believed that this is because hydrogen, which is released due to the decomposition of ammonium ($NH_3$) gas used as a nitride source in growing the second semiconductor layer 104, is bonded to a p-type dopant such as Mg or Zn to inhibit the acceptor action of the dopant.

Thus, various methods for forming a p-type semiconductor layer by making the p-type dopant introduced act as an acceptor, i.e., by activating the dopant, have already been proposed.

According to a first exemplary method, the second semiconductor layer 104 doped with a p-type dopant is exposed to an electron beam as disclosed in Japanese Patent Publication for Opposition No. 6-9258.

A second exemplary method is disclosed in Japanese Laid-Open Publication No. 8-213656, for example. According to the second method, the second semiconductor layer 104 is heated up to about 800° C. within an inert gas ambient.

The electrical energy of the electrons in the electron beam irradiated according to the first method or the thermal energy created according to the second method might dissociate hydrogen, which has been bonded to the p-type dopant such as Mg or Zn, from the dopant. Then, that dissociated hydrogen might detach itself from the second semiconductor layer 104, thereby possibly activating the p-type dopant as an acceptor.

According to a third exemplary method as disclosed in Japanese Laid-Open Publications Nos. 6-275868 and 10-163529, the second semiconductor layer 104 is annealed within nitrogen ambient and oxygen ambient, respectively, to activate Mg in the second semiconductor layer 104.

A fourth exemplary method is disclosed in Japanese Laid-Open Publication No. 10-144960, for example, in which the second semiconductor layer 104 is plasma annealed.

According to any of these proposed methods for forming a p-type semiconductor layer, the second semiconductor layer 104 shows a resistivity of about 1 $\Omega$cm and a p-side electrode 105 can be in ohmic contact with the second semiconductor layer 104 at a contact resistivity of about $1 \times 10^{-3}$ $\Omega$cm$^2$.

These conventional methods for forming a p-type semiconductor layer among Group III nitride semiconductor layers, however, have the following drawbacks.

According to the first method, the electron beam irradiated has a spot diameter of at most 50 to 60 $\mu$m. Thus, when the substrate 101 has a size of approximately 2 centimeters square, it takes more than 10 hours to expose the entire upper surface of the second semiconductor layer 104 to the electron beam, or to finish processing a single substrate 101. Therefore, it is difficult to apply such a method to mass production, and it is impossible to process a plurality of substrates 101 in parallel.

Under the second and third methods, the second semiconductor layer 104 does not show p-type conductivity unless the temperature of the substrate is raised to as high as 600° C. or higher. In annealing the substrate to raise its temperature to 600° C. or higher, however, defects or cracking might be caused in the first or second semiconductor layer 103 or 104 depending on the thermal hysteresis before and after the annealing process. This is because the thermal expansion coefficient of the sapphire substrate 101 is much different from that of the first and second semiconductor layers 103 and 104 of GaN. In addition, if the temperature of the substrate 101 reaches 600° C. or higher, nitrogen might detach itself from the first and second semiconductor layers 103 and 104 or Mg might thermally diffuse from the second semiconductor layer 104 into the first semiconductor layer 103, thus deteriorating the crystallinity of these semiconductor layers. As a result, the performance of the semiconductor device with such layers also deteriorates.

As for the fourth method, no specific details about plasma annealing are available from the disclosure of the above-cited reference.

SUMMARY OF THE INVENTION

An object of the present invention is forming a p-type layer with a low resistance out of a Group III nitride semiconductor layer in a short time with substantially no defects caused in the semiconductor layer.

A first exemplary method for fabricating a semiconductor device according to the present invention includes the steps of: a) forming a semiconductor layer of a Group III nitride containing a dopant over a substrate; and b) exposing the semiconductor layer to a plasma with the temperature of the substrate kept at about 600° C. or lower, thereby making the conductivity type of the semiconductor layer p-type.

According to the first method, the plasma is highly reactive even at a relatively low temperature and can effectively dissociate the bond of a dopant atom to a hydrogen atom, which usually prevents the dopant from being activated as an acceptor. Thus, no defects or cracking is caused in the semiconductor layer due to the thermal hysteresis, and no dopants diffuse from the resultant p-type semiconductor layer into other adjacent semiconductor layers, either. In addition, the processing time per substrate can be shortened and a plurality of substrates can be processed in parallel by using the plasma, thus further increasing the processing efficiency.

In one embodiment of the present invention, the first method preferably further includes the step of c) forming a p-side electrode out of a metal on the semiconductor layer after the step b) has been performed.

In such an embodiment, the resulting p-side electrode can be in ohmic contact with the p-type semiconductor layer with much more certainty, because the electrode is formed on the high-quality semiconductor layer that has been turned into p-type efficiently. As a result, a semiconductor device of quality can be fabricated efficiently.

In this particular embodiment, the step c) may include annealing the p-side electrode at about 400° C. or lower after the p-side electrode has been formed.

In such an embodiment, the p-side electrode can be alloyed with the semiconductor layer without damaging the crystallinity of the semiconductor layer.

In an alternate embodiment, the step c) may include exposing the semiconductor layer to a plasma after the p-side electrode has been formed.

In such an embodiment, the dopant remaining in the semiconductor layer can be further activated after the p-side electrode has been formed thereon.

In another embodiment of the present invention, the plasma is preferably generated by an RF, ECR or hot-wall process.

In such an embodiment, the plasma can be generated just as intended.

In still another embodiment, the plasma preferably comprises nitrogen plasma.

In such an embodiment, it is possible to prevent nitrogen from detaching itself from the semiconductor layer during the exposure of the nitrogen-containing semiconductor layer to the plasma. Thus, the crystallinity of the semiconductor layer can be kept excellent.

In still another embodiment, the dopant is preferably selected from the group consisting of magnesium (Mg), zinc (Zn), calcium (Ca), strontium (Sr), beryllium (Be), cadmium (Cd), mercury (Hg) and lithium (Li).

In such an embodiment, the semiconductor layer can be turned into p-type with more certainty.

A second exemplary method for fabricating a semiconductor device according to the present invention includes the steps of: a) forming a semiconductor layer of a Group III nitride containing a dopant over a substrate; b) forming a p-side electrode out of a metal on the semiconductor layer; and c) exposing the semiconductor layer to a plasma with the temperature of the substrate kept at about 600° C. or lower after the step b) has been performed, thereby making the conductivity type of the semiconductor layer p-type.

According to the second method, it is possible to effectively dissociate the bond of a dopant atom to a hydrogen atom, for example. Thus, no defects or cracking is caused in the semiconductor layer due to the thermal hysteresis, and no dopants diffuse from the resultant p-type semiconductor layer into other adjacent semiconductor layers, either. In addition, the resulting p-type semiconductor layer can be alloyed with the p-side electrode at the same time.

In one embodiment of the present invention, the metal is preferably selected from the group consisting of nickel (Ni), iron (Fe), copper (Cu), chromium (Cr), tantalum (Ta), vanadium (V), manganese (Mn), aluminum (Al), silver (Ag), palladium (Pd), iridium (Ir), gold (Au) and platinum (Pt).

In such an embodiment, the p-side electrode can be formed on the p-type semiconductor layer of a Group III nitride just as intended.

In another embodiment, the metal is preferably a hydrogen-storing metal selected from the group consisting of titanium (Ti), magnesium (Mg), calcium (Ca), zirconium (Zr), lanthanum (La), niobium (Nb), vanadium (V), nickel (Ni), iron (Fe), manganese (Mn), cobalt (Co), chromium (Cr) and aluminum (Al).

In such an embodiment, since the p-side electrode is made of a hydrogen-storing metal, hydrogen atoms, which have detached themselves from the semiconductor layer, are stored in the hydrogen-storing metal. Accordingly, it is possible to prevent the hydrogen atoms detached from being recombined with the p-type dopant in the semiconductor layer. As a result, the acceptor in the resulting p-type semiconductor layer can be activated at a sufficiently high rate.

In still another embodiment, the step b) preferably includes forming a hydrogen-adsorbing layer out of a hydrogen-storing metal on the semiconductor layer before the p-side electrode is formed.

In such an embodiment, since the hydrogen-adsorbing layer is formed between the p-side electrode and the semiconductor layer, hydrogen atoms, which have detached themselves from the semiconductor layer, are stored in the hydrogen-adsorbing layer. Accordingly, it is possible to prevent the hydrogen atoms detached from being recombined with the p-type dopant in the semiconductor layer. As a result, the acceptor in the resulting p-type semiconductor layer can be activated at a sufficiently high rate.

In this particular embodiment, the hydrogen-storing metal is preferably selected from the group consisting of titanium (Ti), magnesium (Mg), calcium (Ca), zirconium (Zr), lanthanum (La), niobium (Nb), vanadium (V), nickel (Ni), iron (Fe), manganese (Mn), cobalt (Co), chromium (Cr) and aluminum (Al).

In still another embodiment, the plasma preferably comprises nitrogen plasma.

DESCRIPTION OF THE PREFERRED EMBODIMENTS

Embodiment 1

Hereinafter, a first exemplary embodiment of the present invention will be described with reference to the accompanying drawings.

Figures 1A, 1B:
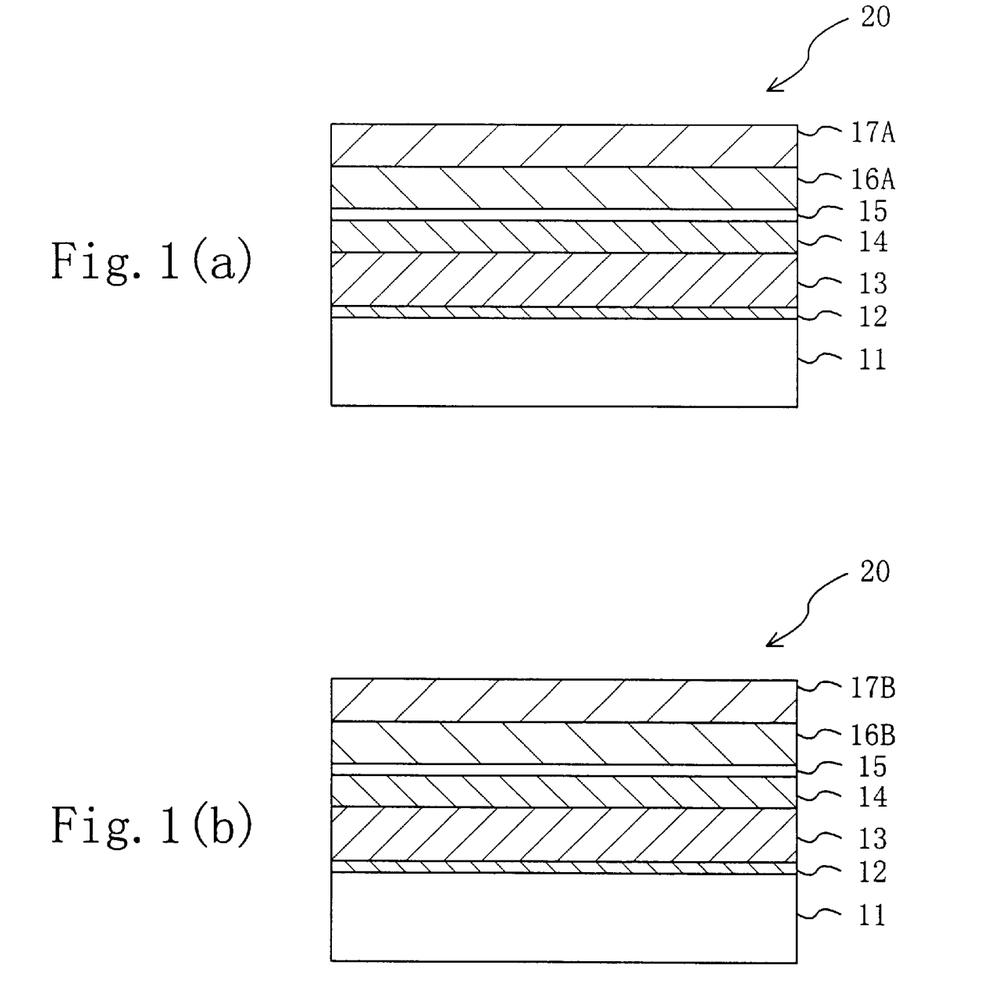
FIGS. 1(a) and 1(b) are cross-sectional views illustrating respective process steps for fabricating a semiconductor device according to a first embodiment of the present invention.
Figure 2:
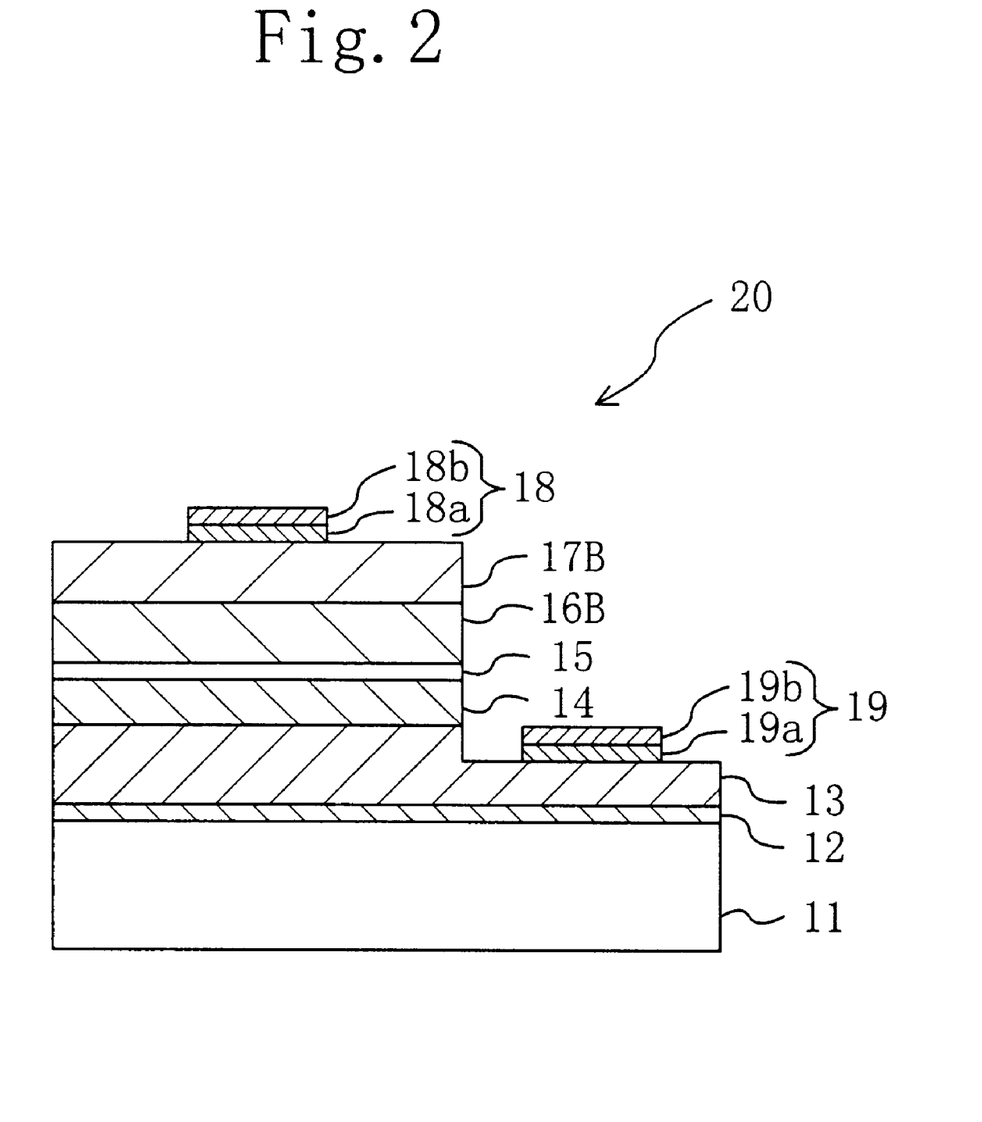
FIG. 2 is a cross-sectional view illustrating another process step for fabricating a semiconductor device according to the first embodiment.

FIGS. 1(a), 1(b) and 2 illustrate cross-sectional structures illustrating respective process steps for fabricating a double-heterojunction nitride semiconductor laser device according to the first embodiment.

As shown in FIG. 1(a), respective epitaxial layers are sequentially grown by metalorganic vapor phase epitaxy (MOVPE), for example, on a principal surface of a sapphire substrate 11, which is a (0001) crystallographic plane. The MOVPE process may be performed under the conditions that trimethylaluminum (TMA), trimethylgallium (TMG) or trimethylindium (TMI) is used as a Group III element source, ammonium (NH$_3$) is used as a nitrogen source, hydrogen is supplied as a carrier gas and the pressure is kept at about 50 Torr (where 1 Torr is approximately equal to 133.3 Pa).

Specifically, first, an AlN buffer layer 12 is grown on the substrate 11 to a thickness of about 40 nm using TMA and NH$_3$ as source materials and keeping a crystal growth temperature at about 500° C. Next, an n-type GaN contact layer 13 is grown to a thickness of about 1.0 μm while raising the growth temperature up to 1000° C., changing the Group III element source from TMA into TMG, and adding silicon (Si) as an n-type dopant. Thereafter, an n-type AlGaN cladding layer 14 is grown to be about 0.7 μm thick while adding an appropriate amount of TMA to TMG. Then, an InGaN multiple quantum well active layer 15 is grown to be about 50 nm thick in total with the growth temperature lowered to about 800° C. and an appropriate amount of TMI added instead of TMA. Next, a first Mg-doped layer 16A of AlGaN is grown to be about 0.7 μm thick while raising the growth temperature to about 1000° C., stopping the supply of the n-type dopant, adding cyclopentadienylmagnesium (Cp$_2$Mg), containing Mg as a p-type dopant, and supplying an appropriate amount of TMA instead of TMI. Then, a second Mg-doped layer 17A of GaN is grown to a thickness of about 1.0 μm using only TMG as the Group III element source. An epitaxial substrate 20 is obtained in this manner. The concentration of Mg in the second Mg-doped layer 17A is set at about $2\times10^{19}$ cm$^{-3}$. In this case, hydrogen, which has been released by the decomposition of NH$_3$ as the nitrogen source, is bonded to Mg contained in the first and second Mg-doped layers 16A and 17A.

Then, the epitaxial substrate 20, on which the respective layers 12, 13, 14, 15, 16A and 17A have been stacked, is introduced into a plasma processor.

Figure 3:
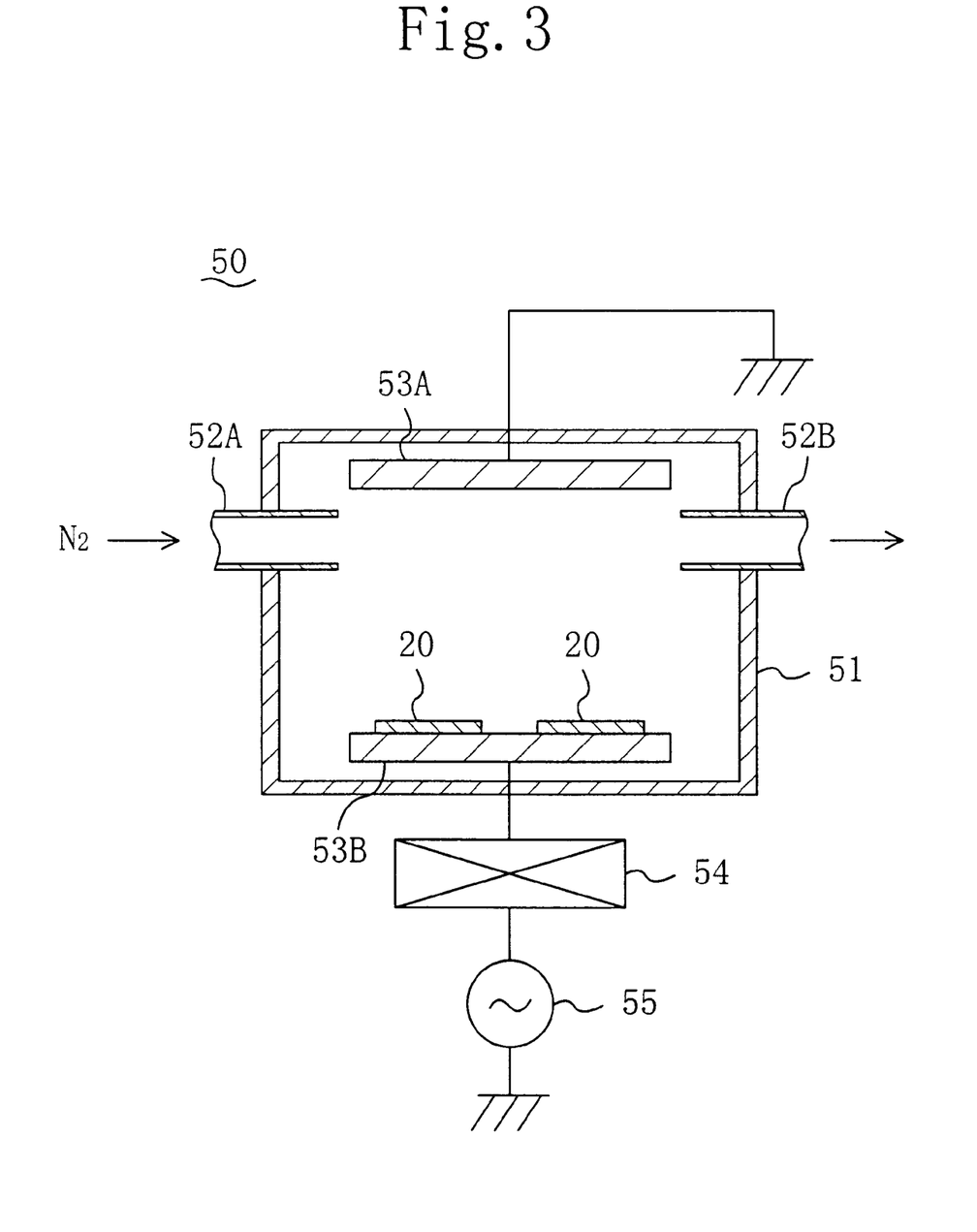
FIG. 3 is a schematic cross-sectional view illustrating a plasma processor for use in the method for fabricating a semiconductor device according to the first embodiment.

Next, a plasma processor according to the first embodiment will be described with reference to FIG. 3. FIG. 3 schematically illustrates a cross section of a plasma processor 50 according to the first embodiment. As shown in FIG. 3, the plasma processor 50 includes: a vacuum chamber (i.e., a reaction chamber) 51 with gas inlet and outlet ports 52A and 52B in a pair of opposite walls; and upper and lower electrodes 53A and 53B, which are provided on the upper and lower bottoms of the chamber 51 to face each other and can be heated. The upper electrode 53A is grounded, while the lower electrode 53B is connected to an RF power supply 55 via a matcher 54. The matcher 54 and the RF power supply 55 are both provided outside of the vacuum chamber 51. As can be seen, the plasma processor 50 is a so-called "parallel-plate plasma generator".

One or two epitaxial substrates 20 shown in FIG. 1(a) are placed on the lower electrode 53B of the plasma processor 50 such that the respective upper surfaces of the substrates 20 are uniformly exposed to plasma. Thereafter, the vacuum chamber 51 is evacuated with the temperature of the substrates kept at room temperature. Subsequently, the pressure inside the chamber 51 is adjusted at about $2\times10^{-2}$ Torr with the flow rate of nitrogen gas set at about 5 sccm.

Next, plasma discharge is caused inside the vacuum chamber 51 with an RF power of 150 W or less supplied at 13.56 MHz, thereby filling the vacuum chamber 51 with nitrogen plasma. The epitaxial substrates 20 are exposed to this nitrogen plasma for about 40 minutes.

As a result, Mg, which has been introduced as an acceptor into the first and second Mg-doped layers 16A and 17A, is sufficiently activated even around room temperature. Accordingly, p-type cladding layer 16B and p-type contact layer 17B, which both have a low resistance and excellent crystallinity, are formed out of the first and second Mg-doped layers 16A and 17A, respectively, as shown in FIG. 1(b).

Next, the epitaxial substrate 20, including the p-type layers with a reduced resistance, is introduced into an evaporation system (not shown). First and second metal films 18a and 18b of Ni and Au are deposited on the p-type contact layer 17B in this order to be about 100 nm thick in total, thereby forming a p-side electrode 18 as shown in FIG. 2.

Then, the respective epitaxial layers 13, 14, 15, 16B and 17B on the epitaxial substrate 20 are dry-etched anisotropically, thereby partially exposing the n-type contact layer 13. And first and second metal films 19a and 19b of Ti and Au are deposited on the exposed surface of the n-type contact layer 13 in this order to be about 100 nm thick in total, thereby forming an n-side electrode 19.

Thereafter, the epitaxial substrate 20, on which these electrode prototype films have been deposited, is annealed at about 400° C. within a nitrogen ambient, thereby alloying the electrode prototype films with the respective semiconductor layers adjacent to these films.

It should be noted that the p-side electrode 18 may be alloyed with the contact layer 17B before the n-side electrode 19 is formed.

As described above, the acceptor Mg is activated according to this embodiment by exposing the first and second Mg-doped layers 16A and 17A to the nitrogen plasma. Thus, the number of defects or cracks, which are usually caused in the epitaxial layers due to the thermal hysteresis, can be drastically reduced. Also, the acceptor Mg is much less likely to thermally diffuse from the first Mg-doped layer 16A into the active layer 15. As a result, the operating performance of the semiconductor laser device can be enhanced. In addition, a plurality of substrates can be processed at the same time to activate the acceptor, thus increasing the throughput.

The plasma source does not have to be nitrogen gas. However, since it is possible to prevent nitrogen from detaching itself from the first and second Mg-doped layers 16A and 17A when the nitrogen plasma is used, the performance of the semiconductor laser device can be further improved.

Figure 4:
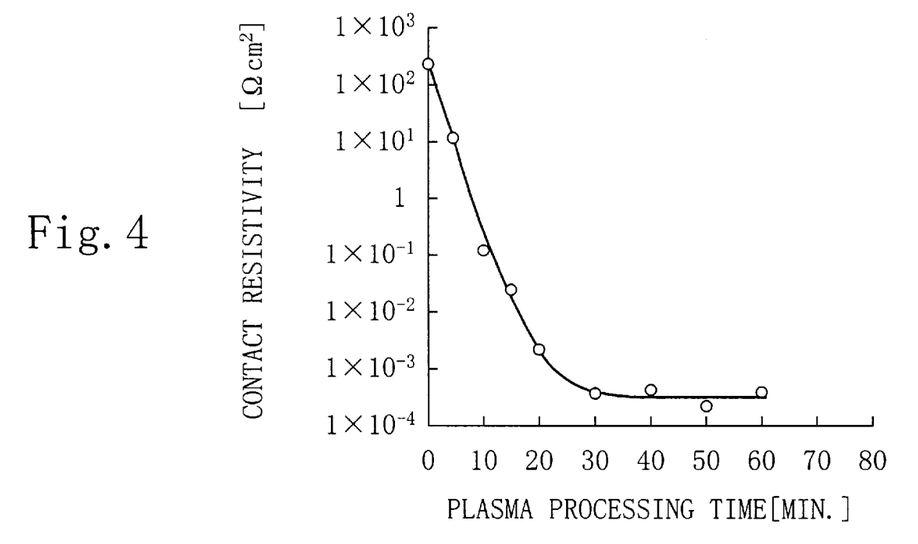
FIG. 4 is a graph illustrating the dependence of a contact resistivity between a p-side electrode and a p-type semiconductor layer on the plasma processing time in the method according to the first embodiment.
Figure 5:
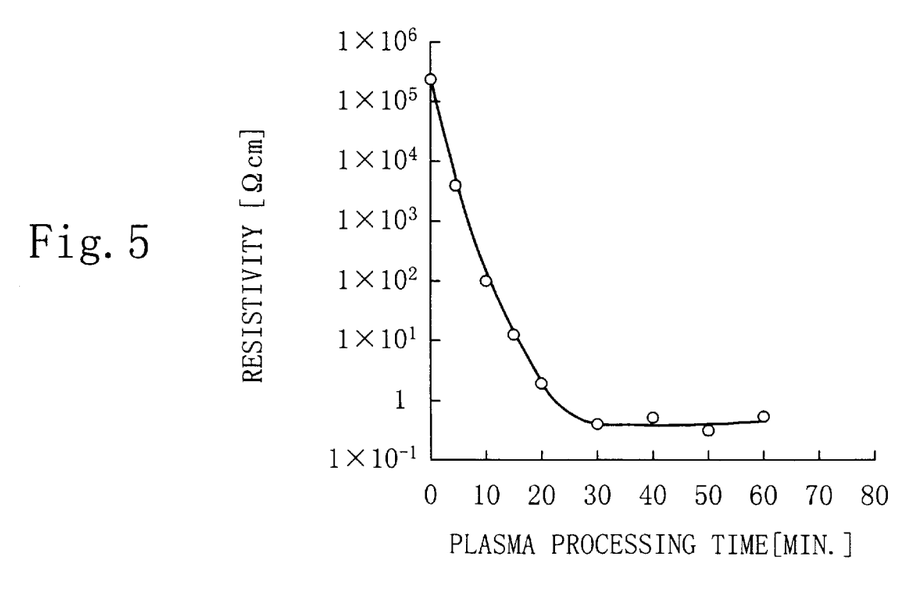
FIG. 5 is a graph illustrating the dependence of the resistivity of a semiconductor device fabricated by the method according to the first embodiment on the plasma processing time.

FIG. 4 illustrates the dependence of a contact resistivity between the p-side electrode 18 and the p-type contact layer 17B on the plasma processing time. FIG. 5 illustrates the dependence of the resistivity of the semiconductor laser device on the plasma processing time. In the illustrated example, the contact resistivity and the resistivity are measured by a transmission line model (TLM) method.

As shown in FIG. 4, the contact resistivity is always lower than $1 \times 10^{-3}$ $\Omega cm^2$, and it can be seen that the p-side electrode 18 is in ohmic contact with the p-type contact layer 17B. The contact resistivity continues to decrease with the processing time until 30 minutes has passed since the start of plasma processing. On and after the processing time exceeds 30 minutes, the contact resistivity is substantially constant at $3.0 \times 10^{-4}$ $\Omega cm^2$, which is about one-third as low as that of the conventional semiconductor device.

Also, as shown in FIG. 5, the resistivity of the semiconductor laser device continues to decrease with the processing time until 30 minutes has passed since the start of plasma processing. On and after the processing time exceeds 30 minutes, the resistivity is substantially constant at 0.4 $\Omega cm$, which is also about one-third as low as that of the conventional semiconductor device.

These results are obtained because the acceptor is activated according to this embodiment without conducting any heat treatment. That is to say, Mg can be activated uniformly within the entire crystal-growing planes of the p-type cladding and contact layers 16B and 17B without damaging the crystallinity thereof, thus increasing the mobility of holes. According to the results of experiments carried out by the present inventors, the mobility of holes when annealing was conducted to activate the acceptor at 600° C. or higher was about 10 $cm^2$/Vsec, while the mobility of holes was about 22 $cm^2$/Vsec according to this embodiment.

If the plasma processing according to this embodiment is performed along with annealing, then the annealing temperature should be 500° C. or lower to prevent nitrogen atoms from detaching themselves from the crystals of respective nitrogen-containing semiconductor layers, specifically, the active layer 15, p-type cladding layer 16B and p-type contact layer 17B, in particular.

Next, it will be described based on the results of several types of experiments how the acceptor can be activated in the p-type nitride semiconductor layers according to the method of this embodiment.

Figure 6:
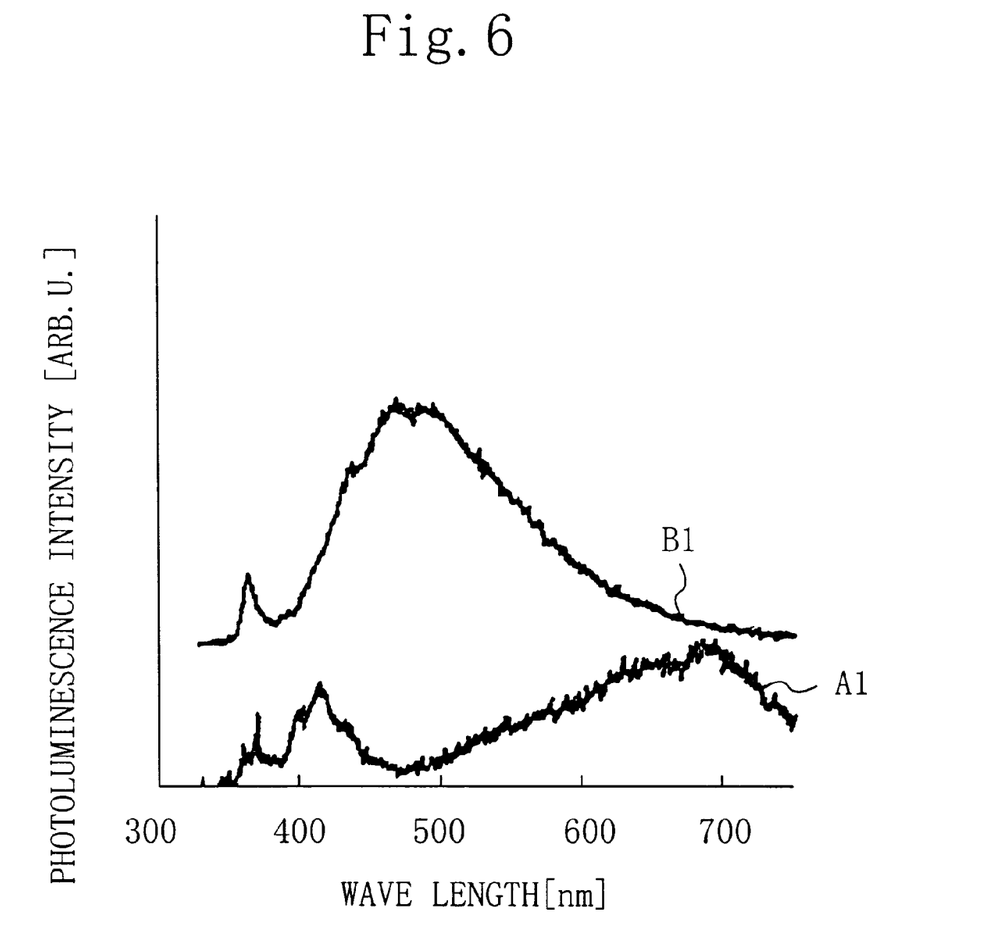
FIG. 6 is a graph illustrating respective photoluminescence intensities of a semiconductor layer that has not been processed with plasma yet and a plasma-processed semiconductor layer in the method according to the first embodiment.

FIG. 6 illustrates respective photoluminescence intensities of the second Mg-doped layer 17A that has not been processed with plasma yet and the p-type contact layer 17B that has already been processed with plasma. In FIG. 6, the curves A1 and B1 represent the photoluminescence intensities before and after the plasma processing, respectively. In this example, He—Cd laser light is used as exciting radiation to measure the photoluminescence intensity. As shown in FIG. 6, a peak of emission resulting from Mg—H bonding appears on the curve A1 at a wavelength of about 680 nm. On the other hand, a peak of emission resulting from the activation of the acceptor Mg due to the dissociation of H appears on the curve B1 at a wavelength of about 470 nm. Thus, it can be seen that Mg, or the p-type dopant, can be activated as an acceptor by performing the plasma processing.

Figure 7:
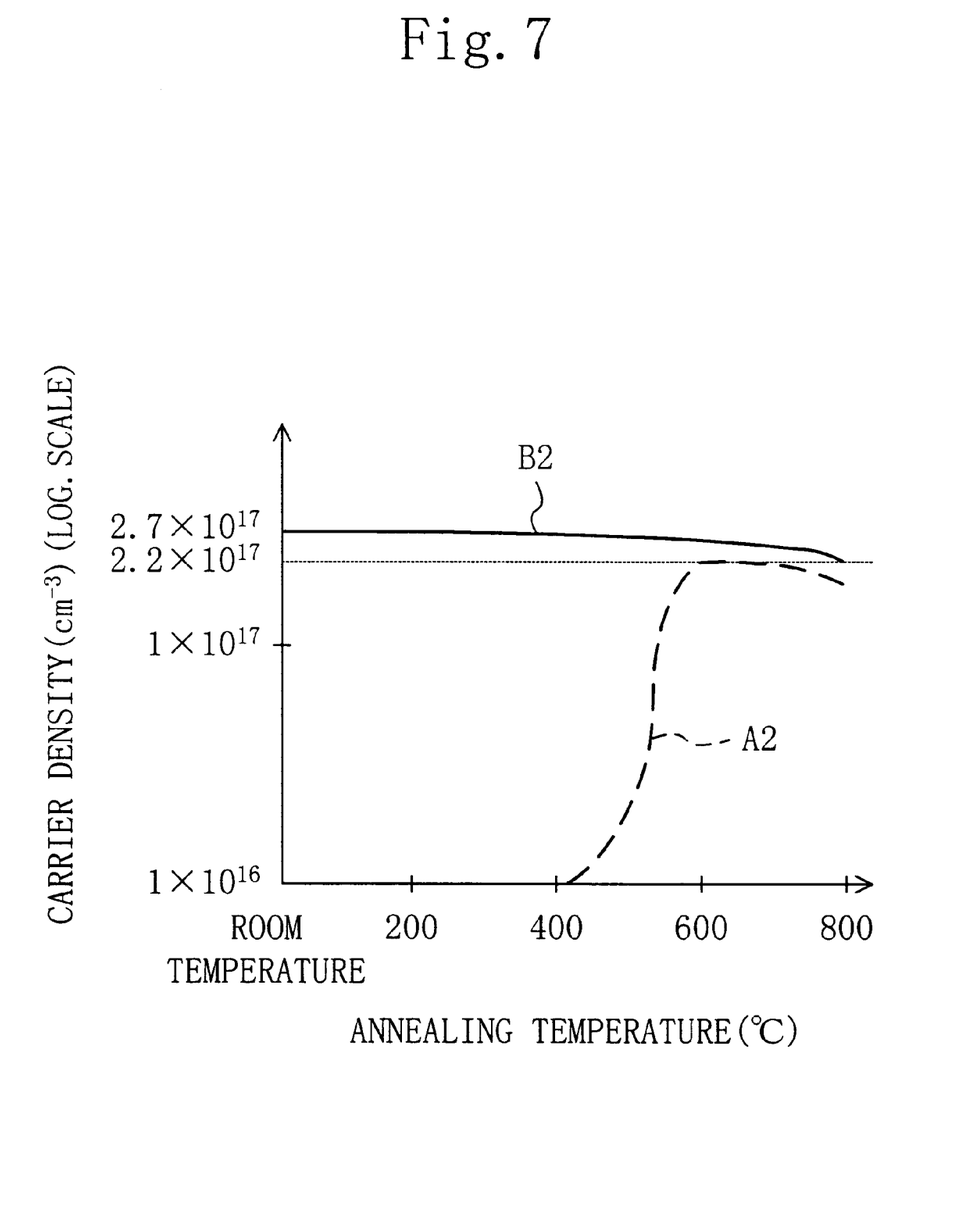
FIG. 7 is a graph illustrating respective dependence of a carrier density on an annealing temperature for the semiconductor layer processed with plasma by the method according to the first embodiment and a semiconductor layer annealed by a conventional method.

FIG. 7 illustrates respective dependence of a carrier (hole) density on an annealing temperature for the p-type contact layer 17B processed with plasma by the method of the first embodiment and a p-type contact layer annealed by a conventional method. In FIG. 7, the curves B2 and A2 represent a carrier density resulting from the inventive plasma processing for 40 minutes and a carrier density resulting the conventional annealing process at 600° C., respectively. These carrier densities were measured by a Hall method. As shown in FIG. 7, when the substrate was annealed at about 600° C. according to the conventional method, the carrier density was about $2.2 \times 10^{17}$ $cm^{-3}$ as represented by the broken curve A2. In contrast, according to the method of the present invention, the carrier density increased to about $2.7 \times 10^{17}$ $cm^{-3}$ as represented by the solid curve B2. As can be seen, the carrier density can be increased according to this embodiment compared to the conventional method.

The second Mg-doped layer 17A that had not been processed with plasma yet and the p-type contact layer 17B that had been processed with plasma for 40 minutes were also analyzed in comparison by secondary ion mass spectroscopy (SIMS) although not shown. As a result, the present inventors confirmed that the concentration of hydrogen in the p-type contact layer 17B that had already been processed with plasma decreased compared to the second Mg-doped layer 17A that had not been exposed to plasma yet. Specifically, the concentration of hydrogen in the second Mg-doped layer 17A was about $1.8 \times 10^{19}$ $cm^{-3}$, while the concentration of hydrogen in the p-type contact layer 17B was about $1.0 \times 10^{19}$ $cm^{-3}$. In addition, no diffusion of Mg into the active layer 15 was observed, either.

Furthermore, when we analyzed the semiconductor laser device according to this embodiment using an electron microscope, almost no defects or cracking due to thermal hysteresis were observed unlike a conventional semiconductor device.

As can be seen, the results of various experiments and analyses prove that the inventive method for fabricating a semiconductor device, more specifically, the method for forming a p-type nitride semiconductor, is much superior to the conventional method.

The properties of the p-type semiconductor layer formed by the method of the present invention are superior to those obtained by the conventional method because of the following reasons:

(1) The surface of the second Mg-doped layer 17A is exposed to the plasma, and no oxide film is formed thereon;

(2) The contaminants attached to the surface of the second Mg-doped layer 17A can be removed by exposing the layer to the plasma, and the resulting p-type contact layer 17B can have a cleaner surface; and (3) The plasma exposure can detach hydrogen from the surface of the second Mg-doped layer 17A more efficiently than the conventional annealing process, and Mg within the surface of the second Mg-doped layer 17A can be activated to a higher degree.

It should be noted that the p-side electrode 18 shown in FIG. 2 is also preferably alloyed by conducting plasma annealing at about 400° C. within a nitrogen ambient using the plasma processor 50 shown in FIG. 3. In such a case, it is possible to prevent the hydrogen atoms detached from being recombined with the p-type dopant in the semiconductor layer during an evaporation process step for forming electrodes, for example.

Also, part or all of the plasma processing may be performed not only to activate the acceptor, but also to alloy the electrodes.

Moreover, the p-side electrode 18 is preferably made of a hydrogen-storing metal. Specifically, the p-side electrode 18 may be made of titanium, magnesium, calcium, zirconium, lanthanum, niobium, vanadium, nickel, iron, manganese, cobalt, chromium or aluminum or may also be made of an alloy containing at least two of these. Also, the p-side electrode 18 should be formed so as to be in ohmic contact with the p-type contact layer 17B. In such a case, even if hydrogen detaches itself from the p-type semiconductor layer during the process step of activating the acceptor through plasma processing, that hydrogen can be adsorbed into the p-side electrode 18 made of a hydrogen-storing metal. Accordingly, it is possible to prevent the hydrogen atoms, which have detached themselves from the p-type semiconductor layer, from being recombined with the p-type dopant in the semiconductor layer.

Embodiment 2

Next, a second exemplary embodiment of the present invention will be described with reference to the accompanying drawings.

Figure 8A:
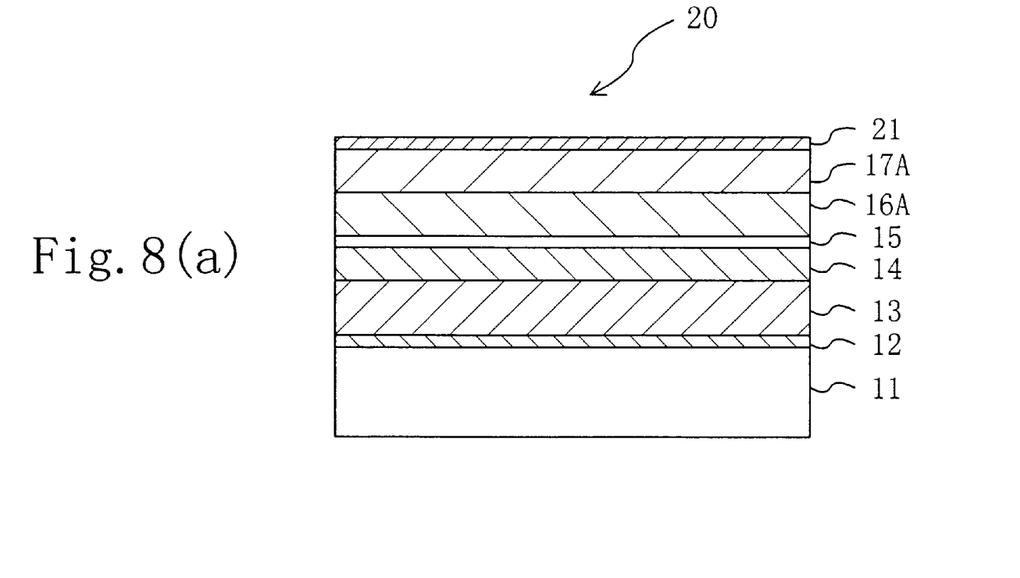
FIGS. 8(a) and 8(b) are cross-sectional views illustrating respective process steps for fabricating a semiconductor device according to a second embodiment of the present invention.
Figure 8B:
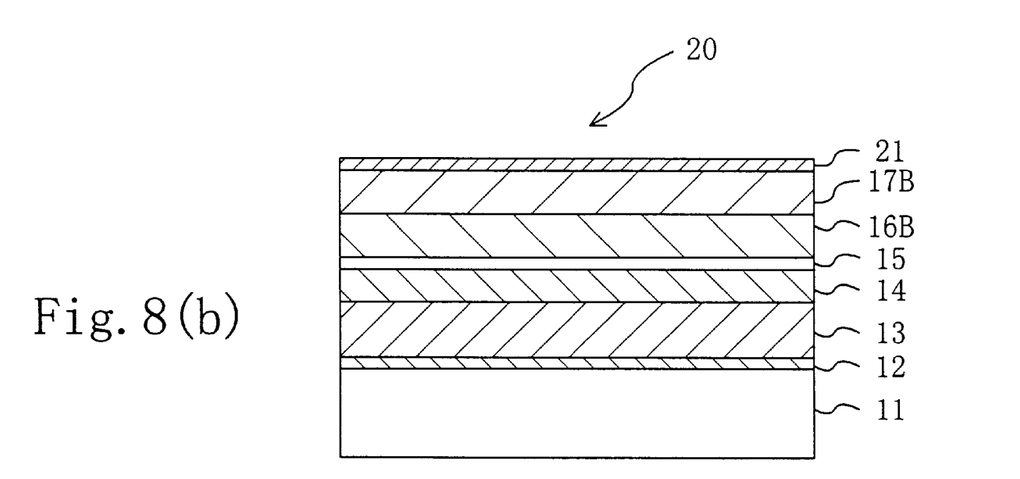
Figure 9:
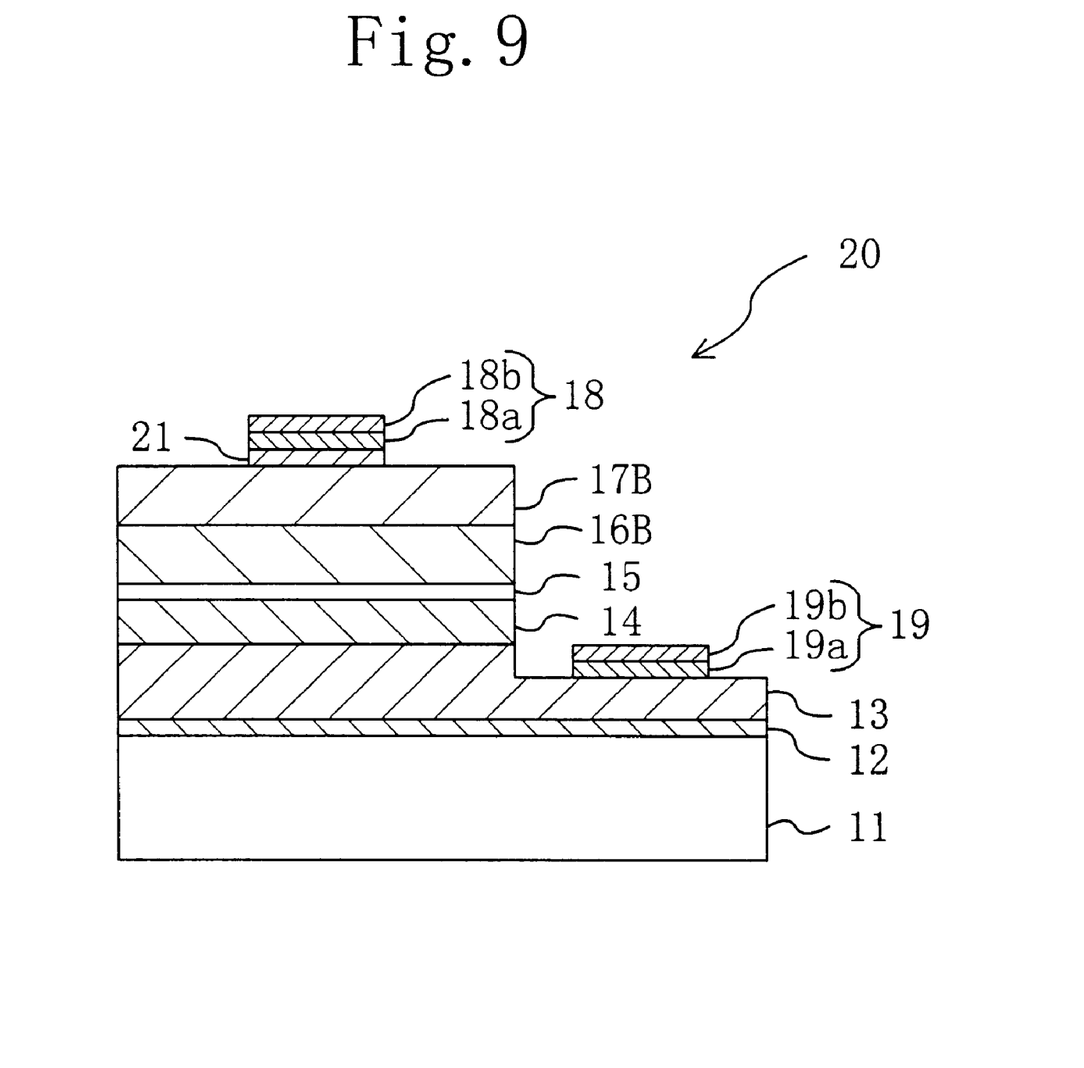
FIG. 9 is a cross-sectional view illustrating another process step for fabricating a semiconductor device according to the second embodiment.

FIGS. 8(a), 8(b) and 9 are cross-sectional views illustrating respective process steps for fabricating a double-heterojunction nitride semiconductor laser device according to the second embodiment. In FIGS. 8(a), 8(b) and 9, the same members as those illustrated in FIGS. 1(a), 1(b) and 2 are identified by the same reference numerals, and the description thereof will be omitted herein.

First, as shown in FIG. 8(a), the respective epitaxial layers 12, 13, 14, 15, 16A and 17A are sequentially grown on the sapphire substrate 11 by an MOVPE process, for example, as in the first embodiment. As a result, the epitaxial substrate 20 is obtained. Thereafter, a hydrogen-adsorbing film 21 made of a hydrogen-storing metal or alloy is formed on the second Mg-doped layer 17A by sputtering or evaporation technique to a thickness of about 50 to about 100 nm.

Next, in the process step of activating the acceptor, the epitaxial substrate 20 including the hydrogen-adsorbing film 21 is introduced into the plasma processor 50 shown in FIG. 3, and then exposed to nitrogen plasma for about 40 minutes. As a result, Mg, or the p-type dopant, is activated and the p-type cladding layer 16B and p-type contact layer 17B are formed out of the first and second Mg-doped layers 16A and 17A, respectively, as shown in FIG. 8(b). In this case, since the hydrogen-adsorbing film 21 is formed on the second Mg-doped layer 17A, hydrogen, which has detached itself from the first and third Mg-doped layers 16A and 17A, is adsorbed into the hydrogen-adsorbing film 21. Accordingly, the hydrogen atoms detached are not recombined with the p-type dopant in the respective semiconductor layers on the epitaxial substrate 20.

Next, as shown in FIG. 9, when the p-side electrode 18 is patterned into a predetermined shape, the hydrogen-adsorbing film 21 is also patterned into the same shape. Subsequently, the p-side electrode 18, hydrogen-adsorbing film 21 and p-type contact layer 17B are alloyed together by annealing the substrate at about 400° C. within a nitrogen ambient. This alloying process may be performed before the p-side electrode 18 is patterned.

It should be noted that the p-side electrode 18 is also preferably alloyed by conducting plasma annealing at about 400° C. within a nitrogen ambient using the plasma processor 50 shown in FIG. 3. In such a case, it is possible to prevent the hydrogen atoms, which have detached themselves from the p-type semiconductor layer, from being recombined with the p-type dopant in the semiconductor layer during an evaporation process step for forming electrodes, for example.

Also, part or all of the plasma processing may be performed not only to activate the acceptor, but also to alloy the electrodes.

The foregoing first and second embodiments may be modified as follows.

The substrate 11 may be made of silicon carbide (SiC), spinel or GaN, not sapphire.

The buffer layer 12 for relaxing the lattice mismatch between the substrate 11 and respective nitride semiconductors grown thereon may be may be GaN, instead of AlN.

In the foregoing embodiments, the p-type semiconductor layers are made of GaN and AlGaN. Alternatively, even when these layers are made of $In_zGa_{1-z}N$ (where $0<z\leq1$) doped with Mg, the acceptor Mg can also be activated at a higher rate.

The p-type dopant to be an acceptor does not have to be Mg, but may be zinc (Zn), calcium (Ca), strontium (Sr), beryllium (Be), cadmium (Cd), mercury (Hg) or lithium (Li).

The p-side electrode 18 may be made of a single-layered metal simple substance selected from the group consisting of nickel (Ni), iron (Fe), copper (Cu), chromium (Cr), tantalum (Ta), vanadium (V), manganese (Mn), aluminum (Al), silver (Ag), palladium (Pd), iridium (Ir), gold (Au) and platinum (Pt). Alternatively, the p-side electrode 18 may be a stack of two or more layers made of respective metal single substances selected from the same group. Furthermore, the p-side electrode 18 may be made of an alloy containing at least two metals selected from the same group.

In the foregoing embodiments, a double-heterojunction semiconductor laser device has been described for the illustrative purposes only as a semiconductor device including a plurality of Group III nitride semiconductor layers with mutually different compositions stacked one upon the other. Instead, the present invention is applicable to any semiconductor device including at least one p-type nitride semiconductor layer.

Also, the plasma generator 50 is supposed to generate plasma by an RF process in the foregoing description. Alternatively, any other process like ECR or hot-wall process may be adopted so long as the epitaxial substrate 20 can be exposed to plasma uniformly.

What is claimed is:

1. A method for fabricating a semiconductor device, comprising the steps of:
   a) forming a semiconductor layer of a Group III nitride containing a dopant over a substrate; and
   b) exposing the semiconductor layer to a plasma with the temperature of the substrate kept at about 600° C. or lower for about 30 to 60 minutes, thereby making the conductivity type of the semiconductor layer p-type.

2. The method of claim 1, further comprising the step of c) forming a p-side electrode out of a metal on the semiconductor layer after the step b) has been performed.

3. The method of claim 2, wherein the step c) comprises annealing the p-side electrode at about 400° C. or lower after the p-side electrode has been performed.

4. The method of claim 2, wherein the step c) comprises exposing the semiconductor layer to a plasma after the p-side electrode has been formed.

5. The method of claim 1, wherein the plasma is generated by an RF, ECR or hot-wall process.

6. The method of claim 1, wherein the plasma comprises nitrogen plasma.

7. The method of claim 1, wherein the dopant is selected from the group consisting of magnesium, zinc, calcium, strontium, beryllium, cadmium, mercury and lithium.

8. A method for fabricating a semiconductor device, comprising the steps of:
   a) forming a semiconductor layer of a Group III nitride containing a dopant over a substrate;
   b) forming a p-side electrode out of a metal on the semiconductor layer; and
   c) exposing the semiconductor layer to a plasma with the temperature of the substrate kept at about 600° C. or lower for about 30 to 60 minutes after the step b) has been performed, thereby making the conductivity type of the semiconductor layer p-type.

9. The method of claim 8, wherein the metal is selected from the group consisting of nickel, iron, copper, chromium, tantalum, vanadium, manganese, aluminum, silver, palladium, iridium, gold and platinum.

10. The method of claim 8, wherein the metal is a hydrogen-storing metal selected from the group consisting of titanium, magnesium, calcium, zirconium, lanthanum, niobium, vanadium, nickel, iron, manganese, cobalt, chromium and aluminum.

11. The method of claim 8, wherein the step b) comprises forming a hydrogen-adsorbing layer out of a hydrogen-storing metal on the semiconductor layer before the p-side electrode is formed.

12. The method of claim 11, wherein the hydrogen-storing metal is selected from the group consisting of titanium, magnesium, calcium, zirconium, lanthanum, niobium, vanadium, nickel, iron, manganese, cobalt, chromium and aluminum.

13. The method of claim 8, wherein the plasma comprises nitrogen plasma.

14. The method of claim 1,
   wherein in the step b), the temperature of the semiconductor layer is kept at about 400° C. or lower.

15. The method of claim 8,
   wherein in the step (b), the temperature of the semiconductor layer is kept at about 400° C. or lower.

* * * * *